United States Patent [19]
Adachi et al.

[11] Patent Number: 5,414,386
[45] Date of Patent: May 9, 1995

[54] MUTING APPARATUS IN CAR AUDIO SYSTEM

[75] Inventors: Hiroo Adachi; Mitsuo Nakazato, both of Kawagoe, Japan

[73] Assignee: Pioneer Electronic Corporation, Tokyo, Japan

[21] Appl. No.: 196,779

[22] Filed: Feb. 15, 1994

[30] Foreign Application Priority Data

Feb. 15, 1993 [JP] Japan .................................. 5-025577

[51] Int. Cl.⁶ .............................................. H05F 1/26
[52] U.S. Cl. ..................... 330/51; 330/149; 381/94
[58] Field of Search .............. 330/51, 149; 381/94; 455/222, 223, 225

[56] References Cited

U.S. PATENT DOCUMENTS 5,063,597 11/1991 Seo et al. ................. 455/222 X
5,208,865 5/1993 Friske et al. .................. 381/84

*Primary Examiner*—James B. Mullins
*Attorney, Agent, or Firm*—Keck, Mahin & Cate

[57] ABSTRACT

A muting apparatus can mute sounds when a voltage drops even in a car audio system in which a digital audio signal is transmitted between audio components units. In the apparatus the drop of the voltage supplied to each of the audio component units is detected in each of the audio component units and, when the drop of the voltage is detected in any one of the audio component units, an analog audio signal is muted immediately before it is converted into an acoustic energy.

2 Claims, 3 Drawing Sheets

MUTING APPARATUS IN CAR AUDIO SYSTEM

BACKGROUND OF THE INVENTION

1. Field of the Invention

The present invention relates to a muting apparatus for use in a car audio system in which a digital audio signal is transmitted between component units of the audio system.

2. Description of Background Information

On-vehicle audio systems (car audio systems) are generally designed that the power voltage of the system is directly supplied from a storage battery of the vehicle. Consequently, when the vehicle has its engine started, the voltage of the storage battery drops. Such drop in voltage of the battery affects the system in operation, often causing the loudspeaker of the system to produce abnormal sounds or noises. In order to prevent such noise the battery voltage is checked to detect the drop of the voltage. When the drop of the voltage is detected, audio signals are muted in the system.

FIG. 1 shows the structure of a conventional car audio system.

In the drawings, there is shown a component-type car audio system which is constructed of a plurality of functional component units, for example such as source unit 1, a graphic equalizer 2, and an amplifier unit 3.

A player 11 in the source unit 1 reproduces music and the like recorded in compact cassette tapes or compact disks to obtain an analog audio signal which is supplied to the graphic equalizer 2 through an audio signal transmission line S1. The voltage supplied from the battery of the vehicle is supplied to the player 11 and also to a power abnormality detection circuit 12. When the supplied voltage drops to a value lower than a predetermined value, the power abnormality detection circuit 12 issues a power abnormality detection signal to a base of a transistor 13.

FIG. 2 shows an example of a concrete construction of the power abnormality detection circuit 12. In the construction shown in FIG. 2, when the voltage supplied from the battery is larger than a breakdown voltage of a Zener diode TD, i.e., when there is no drop in the voltage of the battery, a transistor Q1 is switched on so that the power abnormality detection signal is not issued. On the other hand, when the voltage supplied from the battery is lower than the breakdown voltage of the Zener diode TD, i.e., when there is a drop of the voltage of the battery, the transistor Q1 is switched off so that the power abnormality detection signal is issued.

The transistor 13 has its collector connected with the audio-signal transmission line S1 and its emitter connected to ground, so that the emitter is at ground potential (hereinafter referred to as the GND potential). The transistor 13 is switched on in accordance with the power abnormality detection signal supplied to its base so that the audio-signal transmission line S1 is fixed at the GND potential.

An equalizer circuit 21 in the graphic equalizer unit 2 adequately controls the analog audio signal in frequency characteristics, which audio signal has been supplied through the analog audio-signal transmission line S1. The thus controlled analog audio signal is then supplied to the amplifier unit 3 through an analog audio-signal transmission line $2. The voltage supplied from the battery of the vehicle is supplied to the equalizer circuit 21 and also to the power abnormality detection circuit 22. This detection circuit 22 issues a power abnormality detection signal to a base of a transistor 23 when the thus supplied voltage drops to a value lower than the predetermined value. The transistor 23 has its collector connected with the audio-signal transmission line S2 and its emitter connected to ground, so that the emitter is at the GND potential. The transistor 23 is switched on in accordance with the power abnormality detection signal supplied to its base so that the audio-signal transmission line S2 is fixed at the GND potential.

An amplifier 31 in the amplifier unit 3 adequately amplifies the analog audio signal which has been supplied through the audio-signal transmission line S2. The thus amplified audio signal is then supplied from the amplifier 31 to an input terminal "a" of a relay switch 33 in which the audio signal received in the input terminal "a" is issued from an output terminal b to a loudspeaker 4. The voltage supplied from the battery of the vehicle is supplied to the amplifier 31 and also to the power abnormality detection circuit 32. This detection circuit 32 issues a power abnormality detection signal to a switch-control terminal c of the relay switch 33 when the supplied voltage drops to a value lower than the predetermined value. When the power abnormality detection signal is issued, the relay switch 33 cuts an electric connection between the input terminal "a" and the output terminal b to prevent the analog audio signal from being supplied to the loudspeaker 4, which analog audio signal is issued from the amplifier 31.

As described above, in the conventional car audio system: the power abnormality is detected in each of the components of the system; and, when the power abnormality is detected, the audio-signal transmission line is fixed at the GND potential in each of the components of the system, so that the audio signal is forced to have a value of 0 level, which makes it possible to accomplish a muting condition in which the loudspeaker is prevented from issuing the abnormal sounds or noises when the voltage drops.

However, in recent years, transmission of the audio signal between audio component units is made through digital signals, which makes it impossible to mute the audio signal by fixing the audio-signal transmission line at the GND potential.

OBJECTS AND SUMMARY OF THE INVENTION

The present invention was made to solve the above-mentioned problem. Therefore, it is an object of the present invention to provide a muting apparatus in which an audio signal is muted when a voltage drops even in a car audio system having the audio signal transmitted through digital audio signals.

According to the present invention, in a muting apparatus for use in a car audio system which comprises a plurality of audio component units in which a digital audio signal is transmitted therebetween, a D/A converter for converting a digital signal into an analog signal, the digital signal being transmitted from one of the audio component units, and an electro-acoustic transducer means for converting the analog audio signal into an acoustic energy; the muting apparatus comprises: a power abnormality detection means for generating power abnormality detection signals for the audio component units respectively when a voltage of a power source supplied to each of the audio component units has a value lower than a predetermined value; a muting-demand signal generator means for issuing a muting demand signal when the power abnormality detection signal appears in any one of the audio component units; and muting means for muting the analog audio signal in response to the muting-demand signal.

In the muting apparatus of the present invention, a drop of the voltage supplied to each of the audio component units is detected in each of the audio component units; and, when the drop of the voltage is detected in any one of the audio component units, the analog audio signal is muted immediately before it is converted into the acoustic energy.

DESCRIPTION OF THE PREFERRED EMBODIMENTS

Hereinbelow, the present invention will be described in detail with reference to the drawings.

Figure 3:
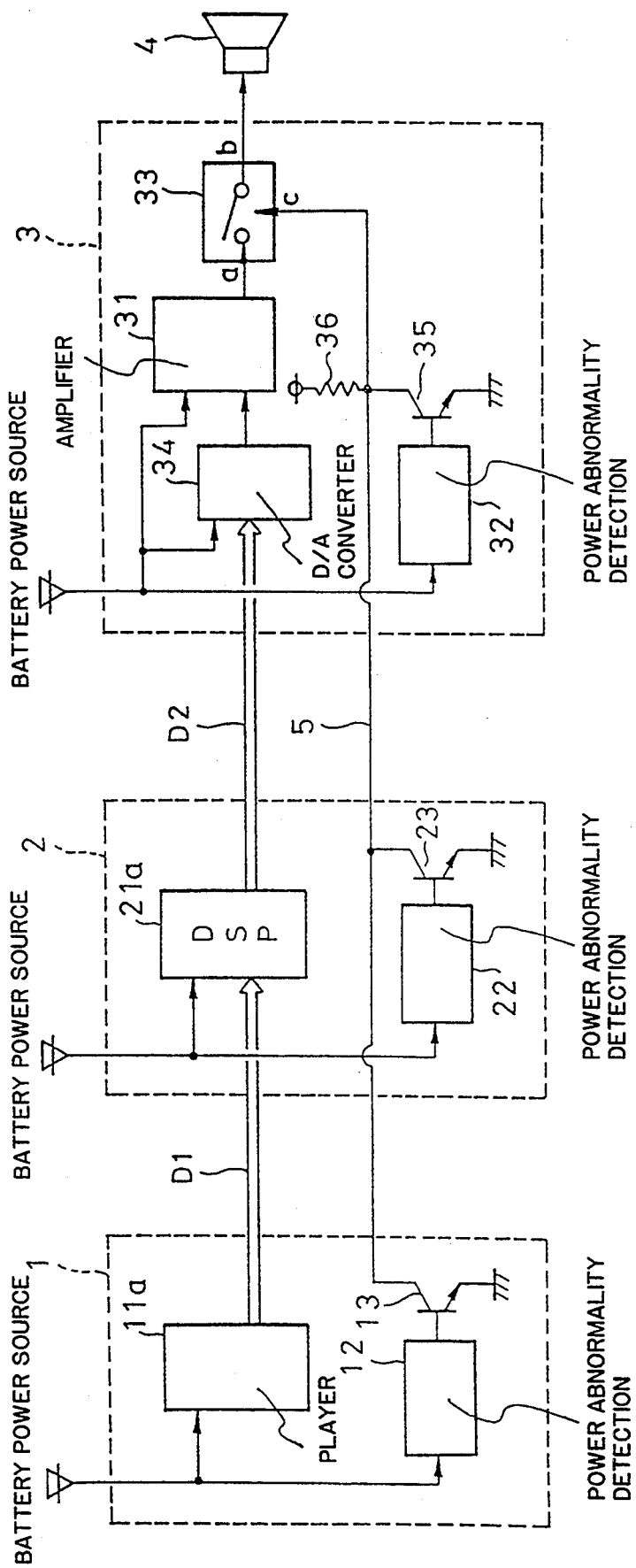
FIG. 3 is a circuit diagram of the muting apparatus of the present invention used in the car audio system.

In FIG. 3, there is shown an embodiment of a muting apparatus of the present invention used in a car audio system.

In the embodiment shown in FIG. 3, a player 11a in a source unit 1 reproduces music and the like recorded in compact cassette tapes or compact disks to obtain a digital audio signal which is supplied to a digital signal processor unit (hereinafter referred to as the DSP unit) 2 through an audio-signal transmission line D1. A voltage supplied from a battery of an automotive vehicle is supplied to a player 11a and also to a power abnormality detection circuit 12. When the thus supplied voltage drops to a value lower than a predetermined value, the power abnormality detection circuit 12 issues a power abnormality detection signal to a base of a transistor 13. The transistor 13 has its collector connected with a muting-demand bus line 5 and its emitter connected to ground, so that the emitter is fixed at the GND potential. The transistor 13 is switched on in accordance with the power abnormality detection signal supplied to its base so that a muting-demand signal fixed at the GND potential is issued to the muting-demand bus line 5.

A digital signal processor (hereinafter referred to as the DSP processor) 21a in the DSP unit 2 adequately controls the digital audio signal in frequency characteristics, which digital audio signal is supplied through the audio-signal transmission line D1. In the DSP 21a, the digital audio signal thus controlled in frequency characteristics is further treated through a sound-field calibration process in which a desired reflection sound is added to the thus controlled digital audio signal. Then, the digital audio signal is issued to an amplifier unit 3 through an audio-signal transmission line D2. The voltage supplied from the battery of the vehicle is supplied to the DSP 21a and also to a power abnormality detection circuit 22. The detection circuit 22 issues a power abnormality detection signal to the base of a transistor 23 when the thus supplied voltage has a value lower than the predetermined value. The transistor 23 has its collector connected with the muting-demand bus line 5 and its emitter connected to ground, so that the emitter is fixed at the GND potential. The transistor 23 is switched on in accordance with the power abnormality detection signal supplied to its base so that a muting-demand signal fixed at the GND potential is issued to the muting-demand bus line 5.

Figure 1:
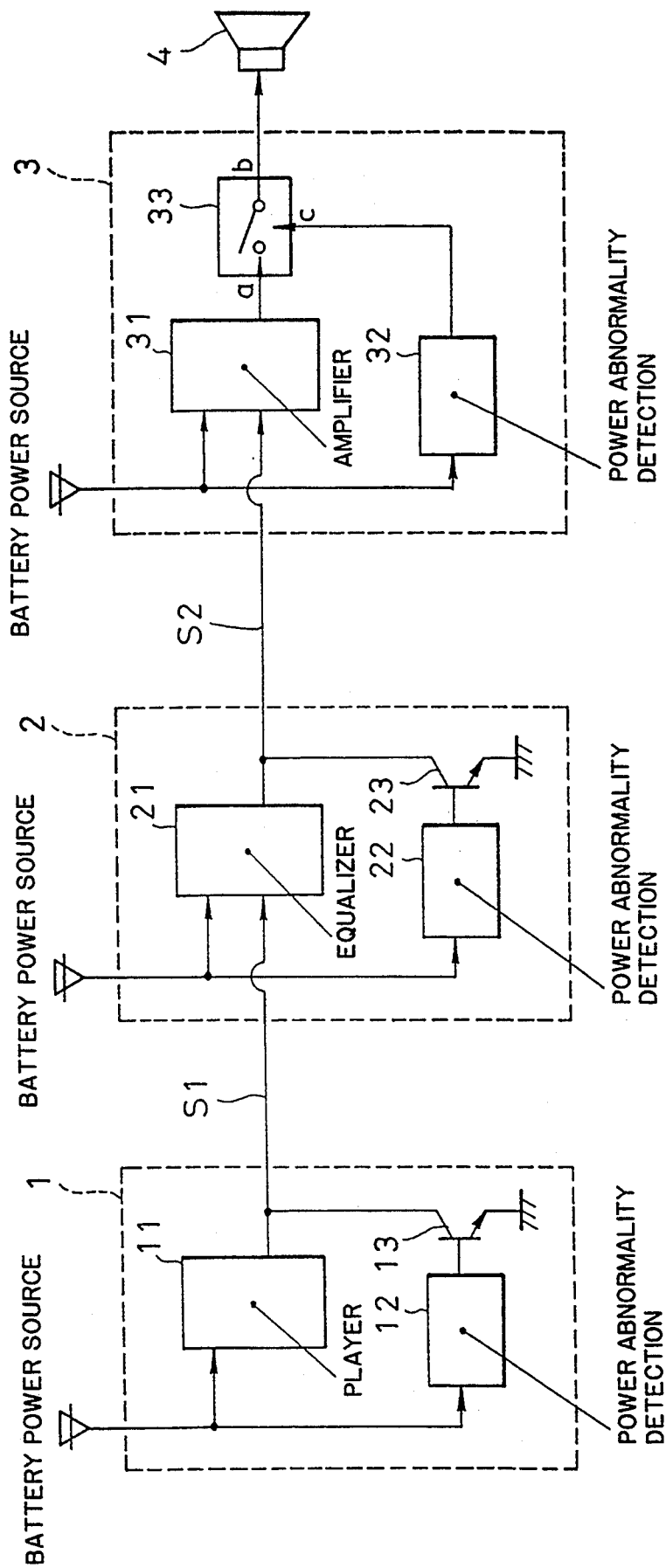
FIG. 1 is a circuit diagram of the conventional car audio system.
Figure 2:
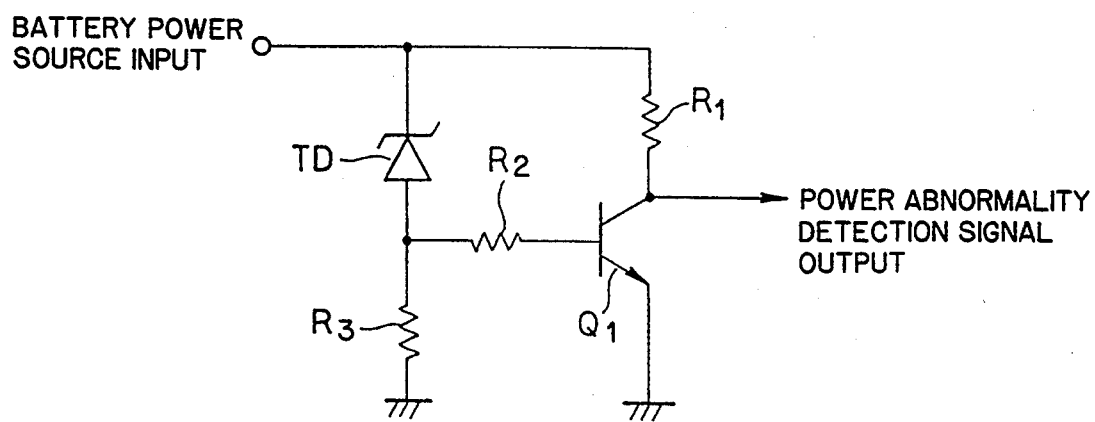
FIG. 2 is a circuit diagram of an example of the power abnormality detection circuit employed in the conventional system shown in FIG. 1.

A D/A converter 34 in the amplifier unit 3 converts the digital audio signal into an analog audio signal, which digital audio signal is supplied through the audio-signal transmission line D2. The thus converted analog audio signal is supplied to an amplifier 31 from the D/A converter 34. The amplifier 31 adequately amplifies the thus supplied analog audio signal. Then, the analog audio signal thus amplified is supplied to an input terminal "a" of a relay switch 33 from the amplifier 31. The relay switch 33 supplies the analog audio signal received in its input terminal "a" to a loudspeaker 4 from its output terminal b. The voltage supplied from the battery of the vehicle is also supplied to a power abnormality detection circuit 32 in addition to the amplifier 31 and the D/A converter 34. The power abnormality detection circuit 32 issues a power abnormality detection signal to the base of a transistor 35 when the supplied voltage has a value lower than the predetermined value. The transistor 35 has its collector connected with the muting-demand bus line 5 and its emitter connected to ground, so that the emitter is fixed at the GND potential. The transistor 35 is switched on in accordance with the power abnormality detection signal supplied to its base so that a muting-demand signal fixed at the GND potential is issued to the muting-demand bus line 5. The bus line 5 is pulled up in potential by a predetermined potential Vcc supplied through a resistor 36, and is connected with a switch-control terminal c of the relay switch 33. The power abnormality detection circuits 12, 22, 23 are constructed, for example, as shown in FIG. 2.

Now, the muting apparatus of the present invention will be described in operation.

In case that any drop of the voltage is not detected in any one of the source unit 1, the DSP unit 2, or the amplifier unit 3, all the transistors 13, 23, 33 are switched off so that the muting-demand bus line 5 is fixed at the predetermined potential Vcc supplied through the resistor 36, whereby the analog audio signal issued from the amplifier 31 is supplied to the loudspeaker 4 and converted into an acoustic energy or sounds because the input terminal "a" keeps its connection with the output terminal b alive in the relay switch 33.

On the other hand, when a drop of the voltage is detected in any one of the source unit 1, the DSP unit 2, or the amplifier unit 3, all the transistors 13, 23, 33 are switched on so that the muting-demand signal fixed at the GND potential is issued to the muting-demand bus line 5, whereby the relay switch 33 opens the circuit between the input terminal "a" and the output terminal b to prevent the analog audio signal issued from the amplifier from being supplied to the loudspeaker 4, so that an acoustic muting condition is accomplished.

As described above, in the muting apparatus of the present invention used in the car audio system the drop of the supplied voltage is detected in each of the audio component units and, when the drop of the voltage is detected in any one of the audio component units, the analog audio signal is muted immediately before it is converted into an acoustic energy or sounds.

Consequently, it is possible for the muting apparatus of the present invention to mute the abnormal sounds or noise which is produced when the drop of the voltage appears even in the car audio system in which the digital audio signal is transmitted between the audio component units of the system.

What is claimed is:

1. A muting apparatus for use in a car audio system including a plurality of audio component units in which a digital audio signal is transmitted therebetween, each of said plurality of audio components receiving a voltage level from a power source, a D/A converter for converting a digital signal into an analog signal, said digital signal being transmitted from one of said audio component units, and an electro-acoustic transducer means for converting said analog audio signal into acoustic energy, the apparatus comprising:

a power abnormality detection means for separately monitoring the voltage level of the power source supplied to the plurality of audio component units, and for generating a power abnormality detection signal when the voltage level supplied to one of said audio component units drops to a value lower than a predetermined value;

a muting signal generator means for issuing a muting signal when said power abnormality detection signal appears in any one of said audio component units; and a muting means for muting said analog audio signal in response to said muting signal.

2. A car audio system comprising:

a plurality of audio component units in which a digital audio signal is transmitted therebetween, each of said plurality of audio components receiving a voltage level from a power source;

a D/A converter for converting a digital signal into an analog signal, said digital signal being transmitted from one of said audio component units;

an electro-acoustic transducer means for converting said analog audio signal into acoustic energy;

a power abnormality detection means for separately monitoring the voltage level of the power source supplied to the plurality of audio component units, and for generating a power abnormality detection signal when the voltage level supplied to one of said audio component units drops to a value lower than a predetermined value;

a muting signal generator means for issuing a muting signal when said power abnormality detection signal appears in any one of said audio component units; and a muting means for muting said analog audio signal in response to said muting signal.

* * * * *